United States Patent
Le et al.

(10) Patent No.: US 9,881,854 B2
(45) Date of Patent: *Jan. 30, 2018

(54) CASCODE SEMICONDUCTOR PACKAGE AND RELATED METHODS

(71) Applicant: SEMICONDUCTOR COMPONENTS INDUSTRIES, LLC, Phoenix, AZ (US)

(72) Inventors: Phuong Trong Le, Goodyear, AZ (US); Alexander Young, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/341,735

(22) Filed: Nov. 2, 2016

(65) Prior Publication Data

US 2017/0077015 A1    Mar. 16, 2017

Related U.S. Application Data

(63) Continuation of application No. 14/744,743, filed on Jun. 19, 2015, now Pat. No. 9,496,207.

(51) Int. Cl.
*H01L 29/15* (2006.01)
*H01L 23/495* (2006.01)
(Continued)

(52) U.S. Cl.
CPC .... *H01L 23/49575* (2013.01); *H01L 23/3121* (2013.01); *H01L 23/49562* (2013.01);
(Continued)

(58) Field of Classification Search
CPC ......... H01L 23/49575; H01L 23/49562; H01L 23/49524
(Continued)

(56) References Cited

U.S. PATENT DOCUMENTS 9,496,207 B1 * 11/2016 Le .................... H01L 23/49575
2011/0049580 A1   3/2011 Lui et al.
(Continued)

OTHER PUBLICATIONS

Olatz Idigoras Lertxundi, "(AlGaN/GaN) High electron mobility transistors," published online by Euskal Herriko Unibertsitatea (University of the Basque Country) at least as early as Jan. 9, 2015, available online at nano-bio.ehu.es/files/aurkezpena.ppt at least as early as Jan. 9, 2015, last visited Jan. 9, 2015.
(Continued)

*Primary Examiner* — Anthony Ho
(74) *Attorney, Agent, or Firm* — IPTechLaw

(57) ABSTRACT

A semiconductor package includes an electrically conductive base (base) having a source connector. A drain connector and a gate connector are electrically coupled with the base. A depletion mode gallium nitride field-effect transistor (GaN FET) and an enhancement mode laterally diffused metal-oxide-semiconductor field-effect transistor (LDMOS FET) are also coupled with the base. The gate connector and a gate contact of the LDMOS FET are both included in a first electrical node, the source connector and a source contact of the LDMOS FET are both included in a second electrical node, and the drain connector and a drain contact of the GaN FET are both included in a third electrical node. The GaN FET and LDMOS FET together form a cascode that operates as an enhancement mode amplifier. The semiconductor package does not include an interposer between the GaN FET and the base or between the LDMOS FET and the base.

19 Claims, 3 Drawing Sheets

(51) Int. Cl.
H01L 29/78 (2006.01)
H01L 23/31 (2006.01)
H01L 29/20 (2006.01)
H01L 29/778 (2006.01)
H01L 21/56 (2006.01)
H01L 23/00 (2006.01)

(52) U.S. Cl.
CPC .......... H01L 24/97 (2013.01); H01L 29/2003 (2013.01); H01L 29/7787 (2013.01); H01L 29/7816 (2013.01); H01L 29/7817 (2013.01); H01L 21/561 (2013.01); H01L 23/49524 (2013.01); H01L 24/06 (2013.01); H01L 24/29 (2013.01); H01L 24/32 (2013.01); H01L 24/48 (2013.01); H01L 24/73 (2013.01); H01L 24/83 (2013.01); H01L 2224/04026 (2013.01); H01L 2224/04042 (2013.01); H01L 2224/0603 (2013.01); H01L 2224/06181 (2013.01); H01L 2224/291 (2013.01); H01L 2224/2919 (2013.01); H01L 2224/32245 (2013.01); H01L 2224/48137 (2013.01); H01L 2224/48247 (2013.01); H01L 2224/48257 (2013.01); H01L 2224/73265 (2013.01); H01L 2224/83851 (2013.01); H01L 2224/97 (2013.01); H01L 2924/00014 (2013.01); H01L 2924/1033 (2013.01); H01L 2924/10253 (2013.01); H01L 2924/1306 (2013.01); H01L 2924/13064 (2013.01)

(58) Field of Classification Search
USPC .......................................................... 257/76
See application file for complete search history.

(56) References Cited

U.S. PATENT DOCUMENTS

2012/0223321 A1 9/2012 Lin et al.
2014/0054585 A1 2/2014 Ritenour
2014/0217596 A1 8/2014 Otremba et al.
2014/0225124 A1 8/2014 Otremba et al.

OTHER PUBLICATIONS

Andrew Moore and Jose Jimenez, "GaN RF Technology for Dummies," published online by Qorvo, Inc. at least as early as Feb. 3, 2015, available online at http://media.wiley.com/assets/7280/42/9781118913017_Vol1_GaN-RF-Technology_D.pdf, last visited Feb. 3, 2015.

Stephen L. Colino and Robert A. Beach, Ph.D., "Fundamentals of Gallium Nitride Power Transistors," published online by Efficient Power Conversion Corporation at least as early as Feb. 3, 2015, available online at http://www.digikey.com/Web%20Export/Supplier%20Content/EfficientPowerConversion_917/PDF/EPC_FundamentalsofGNPT.pdf?redirected=1, last visited Feb. 3, 2015.

M. Micovic, T. Tsen, M. Hu, P. Hashimoto, P.J. Willadsen, I. Milosavijevic, A. Schmitz, M. Antcliffe, D. Zhender, J.S. Moon, W.S. Wong, D. Chow, "GaN enhancement/depletion-mode FET logic for mixed signal applications," Abstract, published online by IET Digital Library at least as early as Feb. 3, 2015, available online at http://digital-library.theiet.org/content/journals/10.1049/el_20052263?crawler=true, last visited Feb. 3, 2015.

Alex Lidow, Johan Strydom, Michael de Rooij, Yanping Ma, "Gallium Nitride (GaN) technology overview," published online by EDN Network at least as early as Jan. 3, 2015, available online at http://www.edn.com/design/power-management/4397809/Gallium-Nitride-GaN—technology-overview, last visited Feb. 3, 2015.

Hailing Cheng, "Two-Dimensional Electron Transport in Gallium Nitride and Gallium Arsenide-Based Heterostructures," Ph.D. Dissertation, University of Michigan, published 2011.

Jean-Jacques Delisle, "GaN Enables RF Where LDMOS and GaAs Can't," published online by Microwaves&RF at least as early as Feb. 11, 2014, available online at http://mwrf.com/active-components/gan-enables-rf-where-ldmos-and-gaas-cant, last visited Feb. 20, 2015.

\* cited by examiner

CASCODE SEMICONDUCTOR PACKAGE AND RELATED METHODS

CROSS REFERENCE TO RELATED APPLICATIONS

This application is a continuation application of the earlier U.S. Utility Patent Application to Le, et al. entitled "Cascode Semiconductor Package and Related Methods," application Ser. No. 14/744,743, filed Jun. 19, 2015, now pending, the disclosure of which is hereby incorporated entirely herein by reference.

BACKGROUND

1. Technical Field

Aspects of this document relate generally to semiconductor cascode devices.

2. Background Art

A cascode is a two-stage amplifier having an amplifier and a current buffer. Conventional cascodes formed with semiconductor materials often include two transistors, such as bipolar junction transistors (BJTs) and/or field effect transistors (FETs). One transistor generally operates as a common source or common emitter and the other transistor generally operates as a common gate or common base.

SUMMARY

Implementations of semiconductor packages may include: an electrically conductive base (base) having a source connector; a drain connector electrically coupled with the base; a gate connector electrically coupled with the base; a gallium nitride field-effect transistor (GaN FET) coupled with the base, and; a laterally diffused metal-oxide-semiconductor field-effect transistor (LDMOS FET) coupled with the base and electrically coupled with the GaN FET, the GaN FET and the LDMOS FET together forming a cascode.

Implementations of semiconductor packages may include one, all, or any of the following:

The gate connector and a gate contact of the LDMOS FET may both be included in a first electrical node, the source connector and a source contact of the LDMOS FET may both be included in a second electrical node, and the drain connector and a drain contact of the GaN FET may both be included in a third electrical node.

The GaN FET may be a planar GaN FET having a source contact, a gate contact, and a drain contact on a first side of the GaN FET.

The semiconductor package may not have an interposer between the GaN FET and the base.

The semiconductor package may not have an interposer between the LDMOS FET and the base.

The GaN FET may include a depletion mode GaN FET.

The LDMOS FET may include an enhancement mode LDMOS FET.

The GaN FET may include a high electron mobility transistor (HEMT).

The cascode may operate as an enhancement mode amplifier.

Implementations of semiconductor packages may include: a cascode including: a gallium nitride field-effect transistor (GaN FET) electrically coupled with a laterally-diffused metal-oxide-semiconductor field-effect transistor (LDMOS FET); wherein a source of the LDMOS FET and a gate of the GaN FET are both electrically coupled with a source of the semiconductor package; wherein a gate of the LDMOS FET is electrically coupled with a gate of the semiconductor package, and; wherein a drain of the GaN FET is electrically coupled with a drain of the semiconductor package.

Implementations of semiconductor packages may include one, all, or any of the following:

An encapsulant encapsulating the GaN FET and the LDMOS FET and exposing the gate, the source, and the drain of the semiconductor package through the encapsulant.

The semiconductor package may not include an interposer coupled between the GaN FET and a base of the semiconductor package.

The semiconductor package may not include an interposer coupled between the LDMOS FET and a base of the semiconductor package.

The GaN FET may include a depletion mode GaN FET.

The LDMOS FET may include an enhancement mode LDMOS FET.

The GaN FET may include a high electron mobility transistor (HEMT).

The cascode may operate as an enhancement mode amplifier.

The LDMOS FET may include a first side including the source of the LDMOS FET and a second side including the gate of the LDMOS FET and a drain of the LDMOS FET.

The GaN FET may include a first side coupled with a base of the semiconductor package and a second side including the gate of the GaN FET, the drain of the GaN FET and a source of the GaN FET.

Implementations of semiconductor packages may include: a depletion-mode gallium nitride high electron mobility transistor (GaN HEMT) having a first side physically coupled with an electrically conductive base (base) and a second side including a source contact, a drain contact, and a gate contact, the gate contact electrically coupled with the base through an electrical coupler; a laterally-diffused metal-oxide-semiconductor field-effect transistor (LDMOS FET) having a first side including a source contact physically and electrically coupled with the base and a second side including a gate contact and a drain contact; wherein the GaN HEMT and the LDMOS FET are electrically coupled together to form an enhancement mode cascode; wherein the base includes a source connector and wherein the semiconductor package further includes a gate connector and a drain connector, the gate connector electrically coupled with the gate contact of the LDMOS FET and the drain connector electrically coupled with the drain contact of the GaN HEMT; wherein an encapsulant encapsulates the GaN HEMT and the LDMOS FET and at least partially encapsulates the source connector, the gate connector and the drain connector, and; wherein a gate contact of the gate connector, a source contact of the source connector, and a drain contact of the drain connector are exposed through openings in the encapsulant.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended cascode semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such cascode semiconductor packages and related methods, and implementing components and methods, consistent with the intended operation and methods.

As used herein, an "electrical node" and a "node" are each defined as a region in an electrical circuit where there is no change in potential.

As used herein, an "interposer" is defined as an electrical insulator used to electrically isolate two electrically conductive elements from one another.

Figure 1:
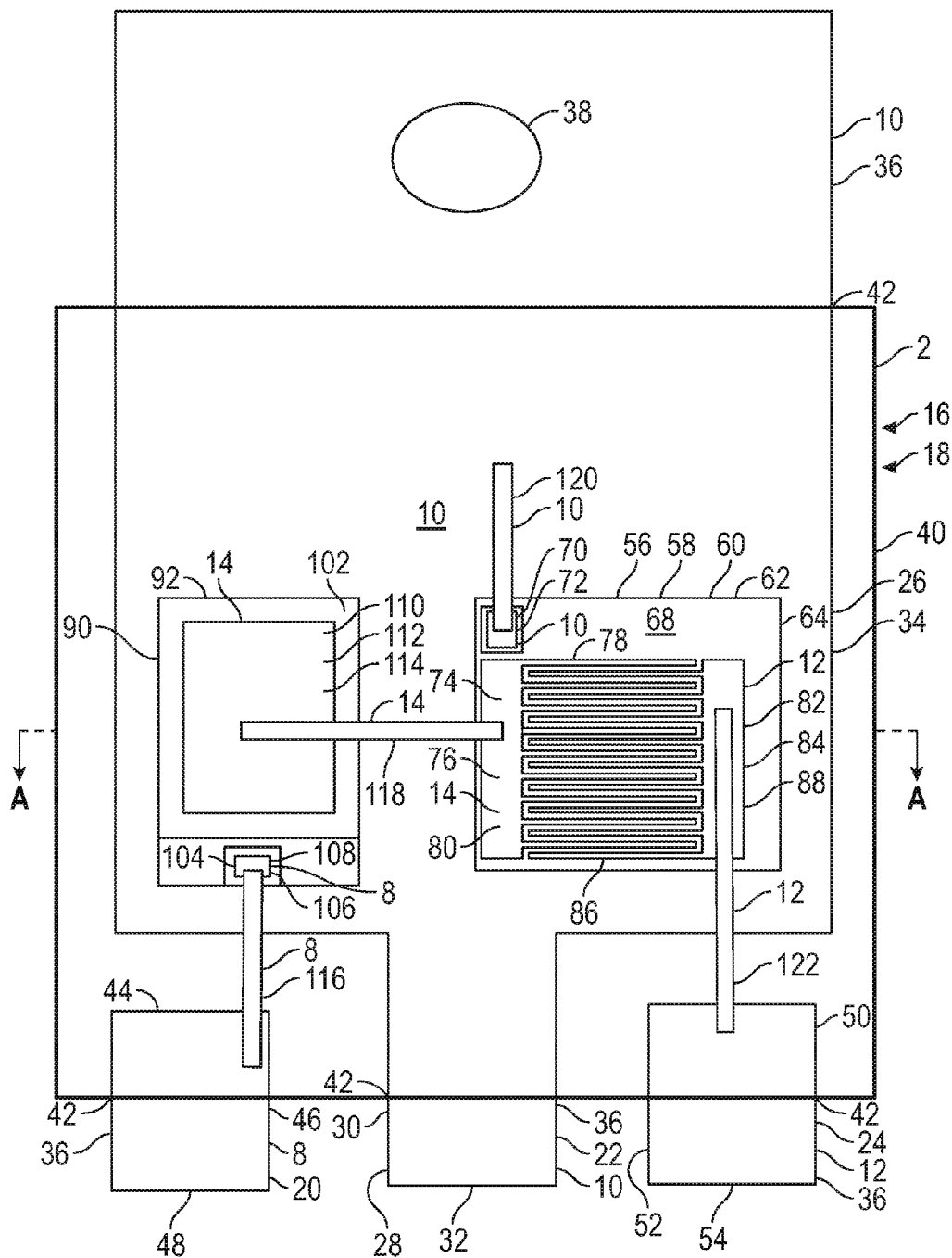
FIG. 1 is a top partial see-through view of an implementation of a cascode packaged using a package with leads.

Referring now to FIG. 1, in implementations a semiconductor package (package) 2 includes a cascode 16 that operates as an enhancement mode amplifier 18. Package 2 includes a gate 20, a source 22, and a drain 24. An electrically conductive base (base) 26 includes a source connector 28, which is a source lead 30 and includes a source contact 32. Base 26 in the implementations shown is a metallic baseplate 34, and it may be seen that when the package is fully formed the base extends both through a front of the package, where the source connector 28 is located, and through a back of the package, wherein an extender having an opening 38 is located. The opening and/or the extender may be used to couple a voltage source to the package in various implementations. The package thus includes four leads 36 extending out of the sides of the package: three leads on a front of the package, including the source connector, a gate connector 44 and a drain connector 50, and the lead 36 extending out the back. The lead extending out the back and the source connector are both integrally formed with the baseplate 34. The gate connector 44 and drain connector 50 are not integrally formed with the baseplate 34, and are not directly coupled to the baseplate, but are indirectly electrically coupled with the baseplate through electrical couplers and other elements as is disclosed herein, and are also indirectly physically coupled with the baseplate through the same elements and through the encapsulant 40.

Figure 2:
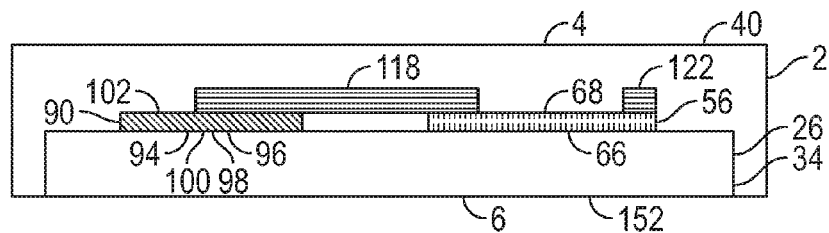
FIG. 2 is a cross-section view of the package of FIG. 1 taken along plane A-A.

Thus, package 2 includes a gate connector 44 which includes a gate lead 46 extending through an opening 42 in the encapsulant and having a gate contact 48. The package 2 also includes a drain connector 50 including a drain lead 52 extending through another opening 42 in the encapsulant and having a drain contact 54. And, as previously described, package 2 includes a source connector 28 including a source lead 30 extending through another opening 42 in the encapsulant and having a source contact 32. The extender at the back of the package 2, as it is integrally formed with the base and the source connector, itself is a lead 36 extending through another opening 42 in the encapsulant, and, as it is directly electrically coupled with the base, it could also serve as a source for the package 2. The extender at the back could also, in implementations, serve as a ground when needed, with an electrical coupler coupling the base to ground when desired through the opening 38. FIG. 2, which is a cross section of the package 2 of FIG. 1 taken along plane A-A, shows that the base actually is exposed on a bottom 6 of the package 2, in implementations. In other implementations the baseplate could be encapsulated at the bottom of the package, though having the base exposed, in implementations, is useful for increased heat extraction from the package. As illustrated, the top 4 of the package 2 can encapsulate the base and the other components of the package 2 that are described herein.

Referring still to FIGS. 1-2, in various implementations a gallium nitride field-effect transistor (GaN FET) 56 is coupled to the base 26. In implementations the GaN FET is a planar GaN FET 58 having a first side 66 directly coupled to the base and a second side 68 (which in the implementation shown is opposite the first side 66) which includes a gate 70, source 74, and drain 82 of the GaN FET. The GaN FET in various implementations is a high electron mobility transistor (HEMT) 60. Also, in various implementations, the GaN FET is a depletion mode GaN FET 62. In the implementation illustrated in FIG. 1 the GaN FET is both an HEMT and a depletion mode GaN FET, and is accordingly a depletion mode gallium nitride high electron mobility transistor (GaN HEMT) 64.

The GaN FET may be formed using a gallium nitride semiconductor grown on a silicon (Si) substrate or a silicon carbide (SiC) substrate. This may be done, by non-limiting example, using various conventional methods, including metal organic chemical vapor deposition (MOCVD), molecular beam epitaxy (MBE), or the like.

A number of techniques may be used to form different regions, interconnections, and the like to form the field-effect transistor. In various implementations, no doping is used in the formation of the GaN FET and instead one or more electron channels are formed with heterojunctions between materials with different band gaps. In other implementations in which doping is used, various doping techniques could be utilized such as, by non-limiting example: vapor-phase epitaxy; dopants added as a boule is grown; diffusion; ion implantation, and the like, and any of these techniques may further use photolithographic techniques to define desired areas for doping. Interconnects, passivation layers, heat sinks, and the like, such as metallic pads, metallic lines, electrical contacts, insulating layers, and the like, may be formed using various conventional deposition techniques such as, by non-limiting example: plating, electroplating, electroless plating, chemical solution deposition (CSD), chemical bath deposition (CBD), spin coating, chemical vapor deposition (CVD), metalorganic chemical vapor deposition (MOCVD), metalorganic vapor phase epitaxy (MOVPE), plasma enhanced CVD (PECVD), atomic layer deposition (ALD), physical vapor deposition (PVD), thermal evaporation, electron beam evaporation, molecular beam epitaxy (MBE), sputtering, pulsed laser deposition, ion beam deposition, cathodic arc deposition (arc-PVD), electrohydrodynamic deposition (electrospray deposition), and any other deposition method. These deposition techniques may include photolithographic techniques and/or may include removal of material such as through physical and/or chemical etching techniques.

Layers may be thinned if desired through such etching techniques, and vias and the like may also be formed if desired through material removal techniques. Aluminum-nitride spacers may be included in the GaN FET, and these may increase electron mobility, though other materials may be used for barriers such as, by non-limiting example: indium aluminum nitride (InAlN), gate metal-insulators (such as nitrides, aluminum oxide deposited through atomic layer deposition (ALD), and the like), and so forth. One or more electron channels of the GaN FET may in various implementations may be formed of gallium nitride though, in other implementations, they may include indium to form indium gallium nitride (InGaN) electron channels. One or more buffers of the GaN FET may be formed of GaN and/or may include low-aluminum gallium nitride (AlGaN). Annealing cycles may also be used in the fabrication of the various regions of the GaN FET.

Once the GaN FET is fabricated and, if applicable, singulated from an array of GaN FETs, it may be coupled with the base such as, by non-limiting example, by adhering it thereto using an adhesive and/or with the use of a pick and place tool. In various implementations, the GaN FET may have an electrical contact on its underside which may be electrically coupled with the base. In other implementations, the GaN FET may not have an electrical contact on its underside. In various implementations where the GaN FET has no electrical contacts on its underside, so that an electrically conductive adhesive (or, for example, a solder) need not be used, though an electrically conductive adhesive or solder could be used if desired. A high thermal-conductivity adhesive could be used as well, whether or not it is electrically conductive. As may be seen from FIGS. 1 and 2, there is no interposer located between the GaN FET and the base, as there is no electrical insulation needed between these elements in this implementation. Excluding an interposer between the GaN FET and the base may result in a decreased package size, fewer processing steps, and/or improved thermal transfer performance.

Referring to FIG. 1, and as described herein, the GaN FET 56 includes a source 74, drain 82, and gate 70. The GaN FET is a depletion mode FET so that current flows from drain to source when there is no gate bias, and current does not flow from drain to source when there is a gate bias applied. In some implementations, the applied gate bias is a negative gate bias or, in other words, during operation, the gate is brought to lower potential than the source. The source includes a pad 76 having a source contact 80 and a plurality of source lines 78 extending from the source contact towards the drain and in electrical communication with the source. The drain 82 includes a pad 84 having a drain contact 88 and a plurality of drain lines 86 extending from the drain contact towards the source and in electrical communication with the drain. The source lines and the drain lines are positioned in an alternating pattern, as may be seen in FIG. 1, to form a line grid array. This alternating pattern of drain lines and source lines may be useful for a planar GaN FET. Since the source and drain current are both on the same side of the die, placing the lines in such an alternating pattern may assist in lower resistance, which may reduce heat, may assist in spreading out the heat throughout the top side of the GaN FET, and/or may increase the surface area or volume at the junction between source and drain for higher electron mobility/throughput.

The drain 82 of the GaN FET is electrically coupled with the drain 24 of the package 2 through an electrical coupler 122. Electrical coupler 122 may be a wirebond, a clip, a thin metallic element that is soldered or otherwise attached such as with a conductive adhesive, and/or the like. The gate 70 of the GaN FET has a gate contact 72, which in the implementations shown is a metallic pad, and the gate contact 72 is electrically coupled with the base 26 using an electrical coupler 120, which in the implementation shown is similar to electrical coupler 122.

Referring still to FIGS. 1 and 2, the package 2 includes a laterally diffused metal-oxide-semiconductor field-effect transistor (LDMOS FET) 90. The LDMOS FET has a first side 94 which includes a source 96 having a source contact 98, which is a pad 100. A second side of the LDMOS FET (which in the implementation shown is on an opposite side of the LDMOS FET from the first side), includes a gate 104 having a gate contact 106, which is a pad 108, and a drain 110 having a drain contact 112, which is a pad 114. The LDMOS FET 90 is an enhancement mode LDMOS FET 92, so that is normally in "off" mode when there is zero gate bias, with current not flowing from drain to source, and when there is gate bias current may accordingly flow from drain to source.

An electrical coupler 116 electrically couples the gate 20 of the package 2 with the gate 104 of the LDMOS FET. Another electrical coupler 118 electrically couples the drain 110 of the LDMOS FET with the source 74 of the GaN FET 56. Electrical couplers 116 and 118 may be similar to the other electrical couplers 120 and 122, previously described, and may be similarly attached.

The LDMOS FET 90 may be formed using any of the fabrication techniques described above with respect to the fabrication of the GaN FET. In implementations the LDMOS FET could be fabricated using a silicon substrate and various ion-implantation and annealing cycles to achieve proper doping profiles for the various regions. Any of the methods described above with respect to the GaN FET, for adding metal layers or contacts or defining the same, may also be used for the LDMOS FET. Once the LDMOS FET is fabricated and/or singulated from an array of LDMOS FETs, it may be placed on the base such as, by non-limiting example, with a pick and place tool, and may be adhered thereto using any of the methods described herein. In the case of the LDMOS FET, however, as the source 96 is on the side of the LDMOS FET that faces the base (in other words, the first side (bottom side) 94), the pad 100 will be attached or coupled to the base using an electrically conductive material, such as an electrically conductive adhesive, an electrically conductive solder, or the like. In other implementations, the LDMOS FET could be formed so that the source 96 is on the second side (top side) 102 and an electrical coupler, similar to others described herein, could be used to electrically couple the source 96 of the LDMOS FET with the base 26. As can be seen from FIGS. 1 and 2, there is also no interposer between the LDMOS FET and the base. As there is no reason to electrically insulate the LDMOS FET from the base, no interposer is needed—instead the first side (bottom side) 94 is directly coupled with the base—and this may reduce device size, reduce processing steps, and/or improve thermal performance.

After the GaN FET and LDMOS FET are placed on the base, and the electrical couplers 116, 118, 120, 122 are coupled in the appropriate places, the encapsulant 40 may be used to encapsulate various elements of the semiconductor device. Various portions of the device, including the base 26, gate connector 44 and drain connector 50 may actually be coupled together or formed from a single piece, such as a leadframe, prior to encapsulation, and after encapsulation a singulation process may be used to separate the package from portions of the leadframe and simultaneously sever portions of the lead frame from one another or in other words those portions that directly couple these elements together. Package 2 is fully formed when the encapsulation process is complete and any singulation step has been performed, forming the structure shown in FIGS. 1-2. In implementations a plurality of packages 2 may be formed using a single leadframe. In such implementations pick and place and encapsulation processes may be used to form an array of unsingulated packages and a singulation process then may be used to form a plurality of singulated packages 2.

It may be seen from FIGS. 1 and 2 that a plurality of electrical nodes (nodes) are formed with the package 2 and its various elements. A first electrical node (node) 8 includes the gate 20 of the package 2, the gate 104 of the LDMOS FET 90, and the electrical coupler 116. A second electrical node (node) 10 includes the source 22 of the package 2 (and, accordingly, the entire base 26), the source 96 of the LDMOS FET 90, the gate 70 of the GAN FET 56, and the electrical coupler 120 which couples the GAN FET 56 to the base 26. A third electrical node (node) 12 includes the drain 24 of the package 2, the drain 82 of the GaN FET 56, and the electrical coupler 122. A fourth electrical node (node) 14 includes the drain 110 of the LDMOS FET 90, the source 74 of the GaN FET 56, and the electrical coupler 118.

In operation, when there is no gate bias at gate 104 of the LDMOS FET (i.e., when there is no gate bias at gate 20 of package 2), the LDMOS FET is in "off" mode so that current cannot flow from the drain to the source of the LDMOS FET. There is thus no current to the source of the GaN FET, and thus no current to the GaN FET drain and, respectively, the package drain 24. Thus, in this state package 2 is in the "off" state.

When there is a gate bias at gate 20 of the package 2, there is a gate bias at gate 104 of the LDMOS FET. The LDMOS FET is thus on the "on" state. In this state, current enters the drain 24 of the package 2 and flows to the GaN drain pad, then through the GaN device to the GaN FET source 74. Current then flows from the GaN FET source 74 through the electrical coupler 118 to the LDMOS FET drain 110, then to the source 96 of the LDMOS FET, and to the source 22 of the package 2. Accordingly, although the GaN FET is a depletion mode FET, by coupling it with the LDMOS FET in the configuration shown, a cascode is formed which operates as an enhancement mode amplifier. Although not specifically depicted in the drawings, the practitioner of ordinary skill in the art will understand that other components may be used to form the amplifier, including resistors and other electrical components, to achieve the desired gain.

Figure 5:
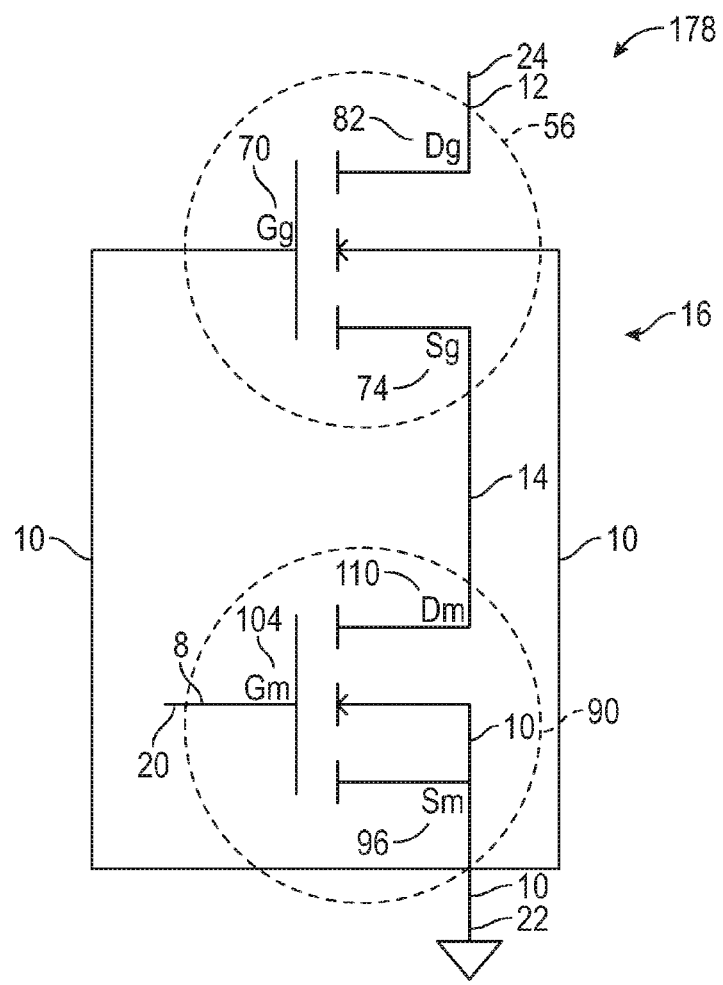
FIG. 5 is a circuit diagram showing several elements of the cascode of FIG. 1.

FIG. 5 shows a circuit diagram 178 which depicts the various elements of GaN FET 56 and LDMOS FET 90 in package 2. Some of these elements are inside the package 2 and others, such as the gate 20, source 22, and drain 24, extend to outside the package 2, as previously described. The nodes 8, 10, 12, and 14 are depicted as well.

Figure 3:
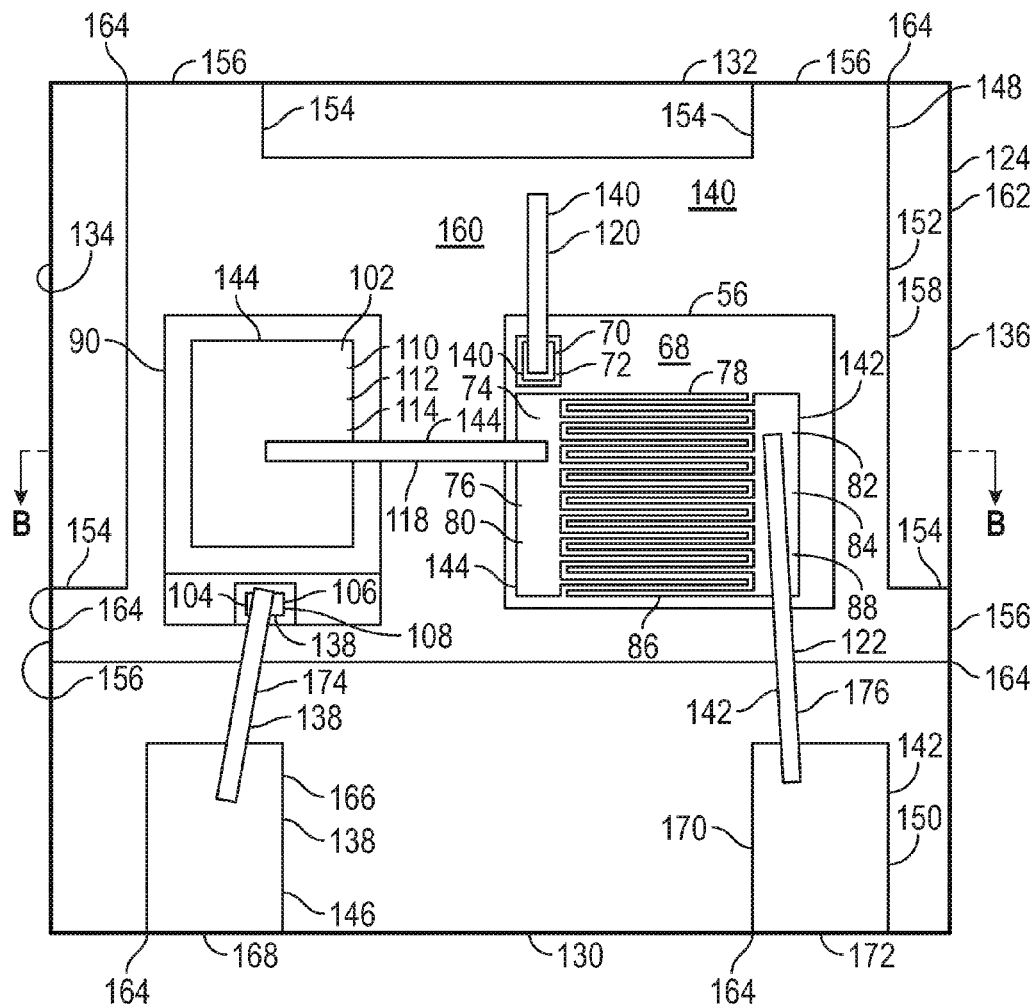
FIG. 3 is a top partial see-through view of an implementation of a cascode packaged using a package without leads.
Figure 4:
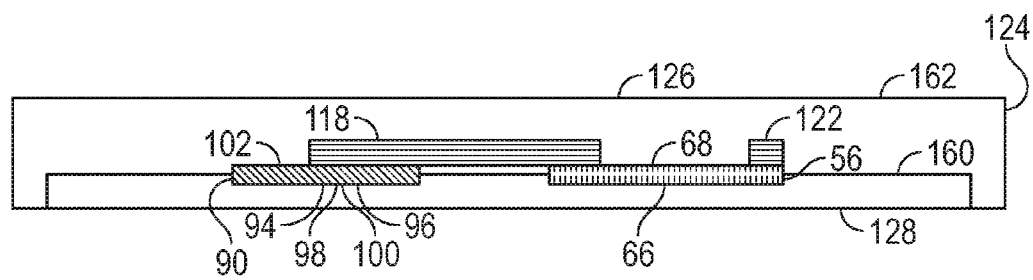
FIG. 4 is a cross-section view of the package of FIG. 3 taken along plane B-B.

Referring now to FIGS. 3-4, in various implementations a semiconductor package (package) 124 is similar in structure to package 2 except in that it is a leadless package. For example, the GaN FET 56 and LDMOS FET 90 of package 124 are the same as those shown in FIGS. 1-2 and 5 and previously described with respect to package 2. Thus the circuit diagram 178 of FIG. 5 applies equally to the package 124 of FIGS. 3-4, and any of the fabrication techniques previously described with respect to package 2 may be also used for the formation of package 124.

Package 124 has a top 126 that is formed by a surface of encapsulant 162 and a bottom 128 that is formed by the encapsulant 162 with the electrically conductive base (base) 152 exposed therethrough. A first side 130 of package 124 includes openings 164 of the encapsulant where a gate contact 168 of a gate connector 166 and a drain contact 172 of a drain connector 170 are exposed. There are also openings 164 in the encapsulant 162 in a second side 132, third side 134 and fourth side 136 of the package 124 where source contacts 156 of source connector 154 are exposed. Package 124 thus has a gate 146, source 148 and drain 150. The gate 146 is coupled with the gate 104 of the LDMOS FET through an electrical coupler 174, forming a first electrical node (node) 138. A second electrical node (node) 140 includes the package source 148, the LDMOS FET source 96, the GaN FET gate 70, and the electrical coupler 120 which couples the base 152 with the GaN FET gate 70. The GaN FET drain 82 is coupled with drain 150 through electrical coupler 176, forming the third electrical node (node) 142. A fourth electrical node (node) 144 includes the drain of the LDMOS FET, the source of the GaN FET, and the electrical coupler 118 which couples these two together. Thus, the circuit diagram 178 could be drawn in identical format, replacing the numbers of the elements of package 2 with the numbers of elements of package 124 with like names, to produce a circuit diagram for package 124.

As may be seen in FIG. 4, in implementations the base 152 is formed of a baseplate 158 having a number of recessions in a first side 160 of the baseplate 158. These may be formed, for example, in a leadframe using selective etching, photolithography, and the like, and may further contribute to a reduced package size.

Because the packages described herein exclude interposers and use the base as a common source for the GaN FET and LDMOS FET, they may reduce assembly steps and assembly complexity; may increase thermal performance of the devices; may allow the devices to operate at higher frequencies; may enhance power handling; may reduce extrinsic parasitic capacitances, inductances and resistances; all of the foregoing; and any combination of the foregoing. The base, which is used as a common source, may be a die flag or flange, and/or may be a ground. In various implementations, the packages described herein may be designed to operate at or around 600 V. The cascodes herein are not formed with vertical trench FET techniques, and thus manufacture and assembly may be easier, more flexible and/or less costly. Packages described herein may be used for power management applications, DC-DC applications, industrial applications, automotive applications, wireless applications, medical applications, cell phone applications, satellite television receiver applications, voltage conversion applications, radar applications, microwave and/or radio frequency (RF) power amplification application, and the like.

Although the cascodes described herein are described as being used as amplifiers, in implementations they could be modified to be used as modulators, such as for amplitude modulation. They may also be combined with voltage ladders to create high-voltage transistors.

In places where the description above refers to particular implementations of cascode semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other cascode semiconductor packages and related methods.

What is claimed is:

1. A semiconductor package, comprising:
   an electrically conductive base (base) comprising a source connector;
   a drain connector electrically coupled with the base;
   a gate connector electrically coupled with the base;
   a gallium nitride field-effect transistor (GaN FET) coupled with the base, wherein the semiconductor package does not comprise an interposer between the GaN FET and the base, and;
   a semiconductor field-effect transistor (FET) coupled with the base and electrically coupled with the GaN FET, the GaN FET and the FET together forming a cascode.

2. The semiconductor package of claim 1, wherein the gate connector and a gate contact of the FET are both comprised in a first electrical node, the source connector and a source contact of the FET are both comprised in a second electrical node, and the drain connector and a drain contact of the GaN FET are both comprised in a third electrical node.

3. The semiconductor package of claim 1, wherein the GaN FET is a planar GaN FET comprising a source contact, a gate contact, and a drain contact on a first side of the GaN FET.

4. The semiconductor package of claim 1, wherein the GaN FET and the FET are within a perimeter of the base.

5. The semiconductor package of claim 1, wherein the GaN FET is a depletion mode GaN FET.

6. The semiconductor package of claim 1, wherein the FET is an enhancement mode FET.

7. The semiconductor package of claim 1, wherein the GaN FET is a high electron mobility transistor (HEMT).

8. The semiconductor package of claim 1, wherein the cascode operates as an enhancement mode amplifier.

9. The semiconductor package of claim 1, wherein the FET is configured as a source-down FET.

10. A semiconductor package, comprising:
    a cascode comprising:
    a gallium nitride field-effect transistor (GaN FET) electrically coupled with a semiconductor field-effect transistor (FET);
    wherein the semiconductor package does not comprise an interposer coupled between the GaN FET and a base of the semiconductor package or the FET and the base of the semiconductor package;
    wherein a source of the FET and a gate of the GaN FET are both electrically coupled with a source of the semiconductor package;
    wherein a gate of the FET is electrically coupled with a gate of the semiconductor package, and;
    wherein a drain of the GaN FET is electrically coupled with a drain of the semiconductor package.

11. The semiconductor package of claim 10, further comprising an encapsulant encapsulating the GaN FET and the FET and exposing the gate, the source, and the drain of the semiconductor package through the encapsulant.

12. The semiconductor package of claim 10, wherein the GaN FET is a depletion mode GaN FET.

13. The semiconductor package of claim 10, wherein the FET is an enhancement mode FET.

14. The semiconductor package of claim 10, wherein the GaN FET is a high electron mobility transistor (HEMT).

15. The semiconductor package of claim 10, wherein the cascode operates as an enhancement mode amplifier.

16. The semiconductor package of claim 10, wherein the FET comprises a first side comprising the source of the FET and a second side comprising the gate of the FET and a drain of the FET.

17. The semiconductor package of claim 10, wherein the GaN FET comprises a first side coupled with a base of the semiconductor package and a second side comprising the gate of the GaN FET, the drain of the GaN FET and a source of the GaN FET.

18. The semiconductor package of claim 10, wherein the FET is configured as a source-down FET.

19. A semiconductor package, comprising:
    a depletion-mode gallium nitride high electron mobility transistor (GaN HEMT) comprising a first side physically coupled with an electrically conductive base (base) and a second side comprising a source contact, a drain contact, and a gate contact, the gate contact electrically coupled with the base through an electrical coupler;
    a source-down semiconductor field-effect transistor (FET) comprising a first side comprising a source contact physically and electrically coupled with the base and a second side comprising a gate contact and a drain contact;
    wherein the GaN HEMT and the FET are electrically coupled together to form an enhancement mode cascode;
    wherein the base comprises a source connector and wherein the semiconductor package further comprises a gate connector and a drain connector, the gate connector electrically coupled with the gate contact of the FET and the drain connector electrically coupled with the drain contact of the GaN HEMT;
    wherein an encapsulant encapsulates the GaN HEMT and the FET and at least partially encapsulates the source connector, the gate connector and the drain connector, and;
    wherein a gate contact of the gate connector, a source contact of the source connector, and a drain contact of the drain connector are exposed through openings in the encapsulant.

* * * * *